(12) United States Patent
Lee et al.

(10) Patent No.: US 11,764,544 B2
(45) Date of Patent: Sep. 19, 2023

(54) VERTICAL-CAVITY SURFACE-EMITTING LASER

(71) Applicant: SEOUL VIOSYS CO., LTD, Ansan-si (KR)

(72) Inventors: Ki Hwang Lee, Ansan-si (KR); Byueng Su Yoo, Ansan-si (KR); Jeong Rae Ro, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 304 days.

(21) Appl. No.: 16/797,479

(22) Filed: Feb. 21, 2020

(65) Prior Publication Data

US 2020/0280175 A1 Sep. 3, 2020

Related U.S. Application Data

(60) Provisional application No. 62/811,624, filed on Feb. 28, 2019.

(51) Int. Cl.
*H01S 5/183* (2006.01)
*H01S 5/42* (2006.01)
*H01S 5/042* (2006.01)

(52) U.S. Cl.
CPC ...... *H01S 5/18311* (2013.01); *H01S 5/04254* (2019.08); *H01S 5/18361* (2013.01); *H01S 5/423* (2013.01)

(58) Field of Classification Search
CPC .. H01S 5/18311; H01S 5/423; H01S 5/18361; H01S 5/04254; H01S 2301/176
See application file for complete search history.

(56) References Cited

U.S. PATENT DOCUMENTS

| | | | |
|---|---|---|---|
| 5,729,566 A * | 3/1998 | Jewell | H01S 5/18341 257/97 |
| 5,882,948 A | 5/1999 | Jewell | |
| 7,957,447 B2 | 6/2011 | Matsushita et al. | |
| 9,742,153 B1 * | 8/2017 | Barve | H01S 5/18311 |

(Continued)

FOREIGN PATENT DOCUMENTS

| | | |
|---|---|---|
| KR | 10-2006-0050164 | 5/2006 |
| KR | 10-2009-0052266 | 5/2009 |
| KR | 10-2017-0099368 | 8/2017 |

OTHER PUBLICATIONS

International Search Report dated Jun. 15, 2020, issued in International Application No. PCT/KR2020/002735 (with English Translation).

(Continued)

*Primary Examiner* — Yuanda Zhang
(74) *Attorney, Agent, or Firm* — H.C. Park & Associates, PLC

(57) ABSTRACT

A vertical-cavity surface-emitting laser (VCSEL) including a lower mirror, an upper mirror, an active layer interposed between the lower mirror and the upper mirror, an aperture forming layer interposed between the upper mirror and the active layer, and including an oxidation layer and a window layer surrounded by the oxidation layer, a ring-shaped trench passing through the upper mirror, the aperture forming layer, and the active layer to define an isolation region therein, and a plurality of oxidation holes disposed in the isolation region surrounded by the trench, and passing through the upper mirror and the aperture forming layer.

19 Claims, 12 Drawing Sheets

(56) References Cited

U.S. PATENT DOCUMENTS

| | | | |
|---|---|---|---|
| 9,929,536 B1* | 3/2018 | Lin | H01S 5/04257 |
| 2004/0091010 A1* | 5/2004 | Choquette | H01S 5/18327 |
| | | | 372/43.01 |
| 2004/0101009 A1* | 5/2004 | Johnson | H01S 5/18308 |
| | | | 372/46.013 |
| 2004/0264541 A1* | 12/2004 | Wang | H01S 5/18313 |
| | | | 372/99 |
| 2006/0013276 A1 | 1/2006 | McHugo | |
| 2008/0187015 A1 | 8/2008 | Yoshikawa et al. | |
| 2008/0279241 A1 | 11/2008 | Oki et al. | |
| 2009/0129419 A1 | 5/2009 | Matsushita et al. | |
| 2010/0177300 A1* | 7/2010 | Kuwata | A61B 5/0261 |
| | | | 372/50.21 |
| 2011/0182314 A1* | 7/2011 | Yoshikawa | H01S 5/18338 |
| | | | 372/46.012 |
| 2013/0163626 A1 | 6/2013 | Seurin et al. | |
| 2013/0223465 A1* | 8/2013 | Uchida | H01S 5/209 |
| | | | 372/50.12 |
| 2017/0244219 A1 | 8/2017 | Barve et al. | |
| 2017/0310086 A1 | 10/2017 | Barve et al. | |

OTHER PUBLICATIONS

Search Report dated Dec. 5, 2022, issued to European Patent Application No. 20762112.

* cited by examiner

VERTICAL-CAVITY SURFACE-EMITTING LASER

CROSS-REFERENCE TO RELATED APPLICATION

This application claims the benefit of U.S. Provisional Application No. 62/811,624, filed on Feb. 28, 2019, which is hereby incorporated by reference for all purposes as if fully set forth herein.

BACKGROUND

Field

Exemplary embodiments of the invention relate to a highly reliable vertical-cavity surface-emitting laser.

Discussion of the Background

A vertical-cavity surface-emitting laser (VCSEL) is a laser that emits a laser beam in a vertical direction from a substrate surface. A typical VCSEL includes an active layer disposed between mirrors. Electrons and holes injected through the mirrors generate light in the active layer, and a laser is generated and emitted through resonance by the mirrors.

Current flowing perpendicular to the VCSEL needs to be limited to a small region, and, to this end, various etching and oxidation processes have been used. For example, an isolated post is formed by etching the mirror layers and the active layer to form a trench in a ring shape, which allows current to be concentrated in an aperture of a small region by forming an oxidation layer using the trench.

However, when the aperture is formed by oxidation using the trench, various problems may occur. For example, oxidation proceeds from the trench into a post. As such, as a diameter of the post becomes larger, the oxidation time becomes longer thereby rendering the oxidation process more difficult. Meanwhile, when a size of the post is reduced, a size of the contact layer in ohmic contact with the upper mirror may also be reduced. In this case, a connection area between the pad electrode and the contact layer may be reduced, thereby adversely affecting reliability.

Furthermore, when forming a plurality of emitter arrays, a plurality of posts surrounded by trenches have to be formed, which may increase manufacturing complexity as a wide area would need to be etched to form the ring-shaped trench. Moreover, when forming a pad electrode, as a connection between the pad and an emitter passes through the trench, the process yield may be lowered as there is a risk of electrical disconnection. In addition, a trench having a large area is formed around the emitter, which may adversely affect the emitter's reliability from a surface defect.

The above information disclosed in this Background section is only for understanding of the background of the inventive concepts, and, therefore, it may contain information that does not constitute prior art.

SUMMARY

VCSELs constructed according to exemplary embodiments of the invention have high reliability and are capable of preventing the occurrence of electrical disconnection due to a trench.

Exemplary embodiments also provide a VCSEL capable of preventing the performance of an emitter from being reduced by defects.

Additional features of the inventive concepts will be set forth in the description which follows, and in part will be apparent from the description, or may be learned by practice of the inventive concepts.

A vertical-cavity surface-emitting laser (VCSEL) according to an exemplary embodiment includes: a lower mirror; an upper mirror; an active layer interposed between the lower mirror and the upper mirror; an aperture forming layer interposed between the upper mirror and the active layer, and including an oxidation layer and a window layer surrounded by the oxidation layer; a ring-shaped trench passing through the upper mirror, the aperture forming layer, and the active layer to define an isolation region therein; and a plurality of oxidation holes disposed in the isolation region surrounded by the trench, and passing through the upper mirror and the aperture forming layer.

The oxidation holes may be disposed in the isolation region surrounded by the trench so that the window layer may be formed precisely, and a surface defect caused during the formation of trench may be prevented from moving near the window layer, thereby providing a highly reliable VCSEL.

The trench may extend to a partial thickness of the lower mirror.

The VCSEL may further include an ohmic contact layer disposed on the upper mirror, in which the ohmic contact layer may include a ring-shaped circular portion and protrusions protruding outwardly from the circular portion, and the oxidation holes may be disposed between the protrusions.

The ohmic contact layer may include the protrusions, and the oxidation holes may be disposed between the protrusions, and thus, the oxidation holes may be disposed at narrower intervals, thereby reducing a size of the emitter.

The ring-shape of the circular portion may be partially incised.

The ohmic contact layer may have a symmetrical structure, such that the protrusions may be spaced apart at an equal interval from one another.

The oxidation holes may have an elliptic shape.

The oxidation holes may have a circular or a quadrangular shape.

The VCSEL may further include a surface protection layer covering the ohmic contact layer and the upper mirror, and an upper insulation layer disposed on the surface protection layer, in which the trench and the oxidation holes may pass through the surface protection layer, and the upper insulation layer may cover the trench and the oxidation holes.

The VCSEL may further include a plurality of via holes passing through the upper insulation layer and the surface protection layer to expose the ohmic contact layer, and the via holes may be disposed to correspond to the protrusions.

The VCSEL may further include a pad and a connector disposed on the upper insulation layer, in which the pad may be disposed outside of the trench, and the connector may extend from the pad and electrically connected to the ohmic contact layer through the via holes.

A VCSEL including an emitter array according to another exemplary embodiment includes: a lower mirror; an upper mirror; an active layer interposed between the lower mirror and the upper mirror; an aperture forming layer interposed between the upper mirror and the active layer, and including an oxidation layer and a window layer surrounded by the oxidation layer; a ring-shaped trench passing through the upper mirror, the aperture forming layer, and the active layer to define an isolation region therein; and a plurality of oxidation holes disposed in the isolation region surrounded by the trench, and passing through the upper mirror and the aperture forming layer, in which the emitter array may include a plurality of emitters and be disposed in the isolation region surrounded by the trench, and the plurality of oxidation holes may be disposed to correspond to the emitters in the emitter array.

The oxidation holes together with the trench may be disposed in the isolation region so that the window layer may be formed precisely, and thus, a surface defect may be prevented from moving to the aperture.

The trench may be extended to a partial thickness of the lower mirror from the upper mirror.

The VCSEL may further include ohmic contact layers disposed on the upper mirror to correspond to each emitter, in which each ohmic contact layer may include a ring-shaped circular portion and protrusions protruding outwardly from the circular portion, and the oxidation holes may be disposed between the protrusions.

The ring-shape of the circular portion may be partially incised.

The ohmic contact layer may have a symmetrical structure, such that the protrusions may be spaced apart at an equal interval from one another.

The VCSEL may further include a surface protection layer covering the ohmic contact layer and the upper mirror, and an upper insulation layer disposed on the surface protection layer, in which the trench and the oxidation holes may pass through the surface protection layer, and the upper insulation layer may cover the trench and the oxidation holes.

The VCSEL may further include a plurality of via holes passing through the upper insulation layer and the surface protection layer to expose the ohmic contact layer, and the via holes may be disposed corresponding to the protrusions.

The VCSEL may further include a pad and a connector disposed on the upper insulation layer, in which the pad may be disposed outside of the trench, and the connector may extend from the pad and electrically connect to the ohmic contact layer through the via holes.

The connector may have a mesh shape including circular openings corresponding to each emitter.

The oxidation holes may have at least one of an elliptic, a circular, and a quadrangular shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
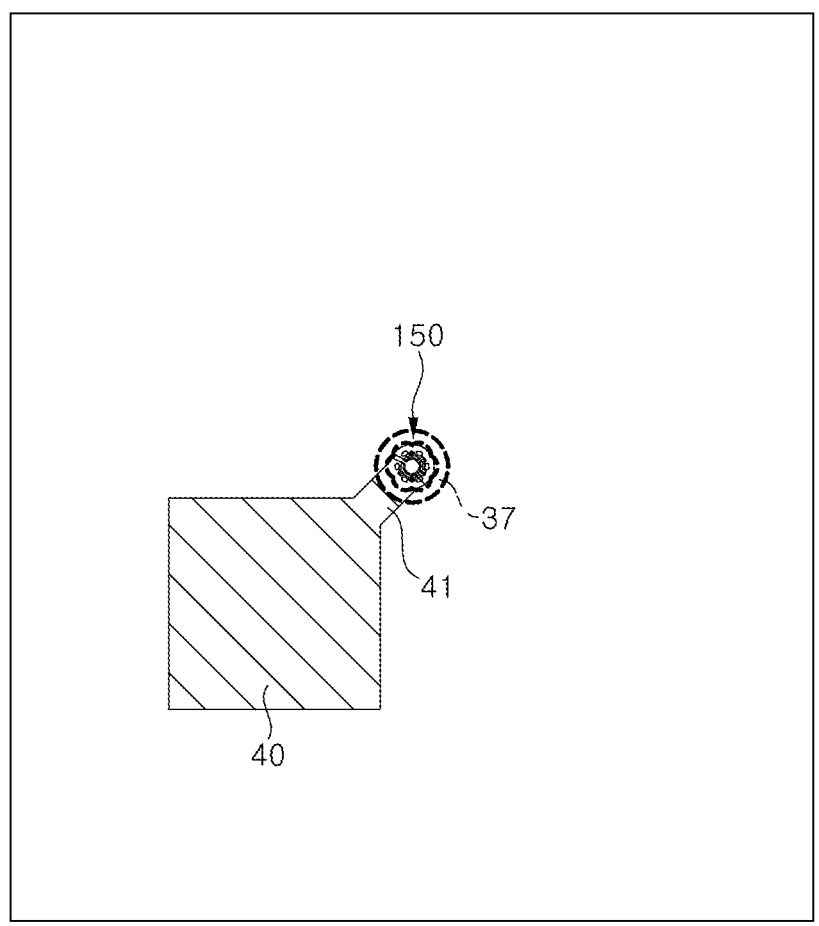
FIG. 1 is a schematic plan view of a VCSEL according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings.

Figure 2A:
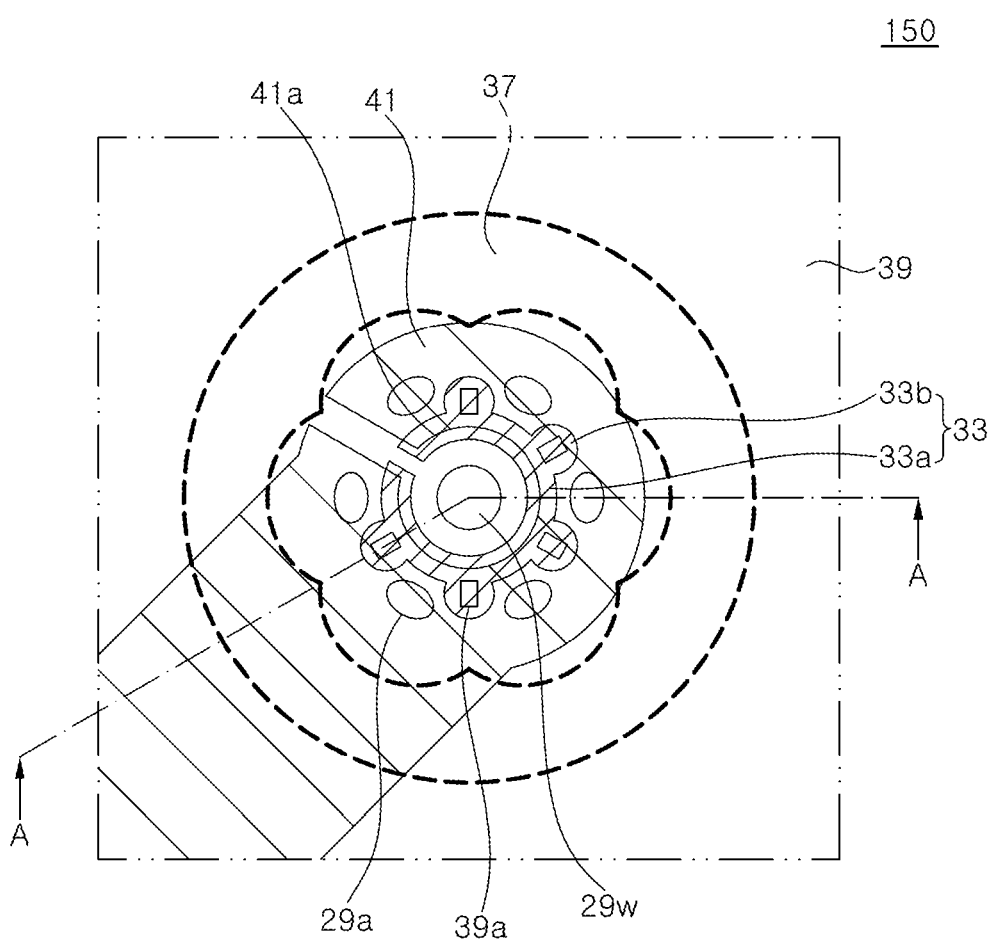
FIG. 2A is an enlarged schematic plan view of an emitter region of FIG. 1.
Figure 2B:
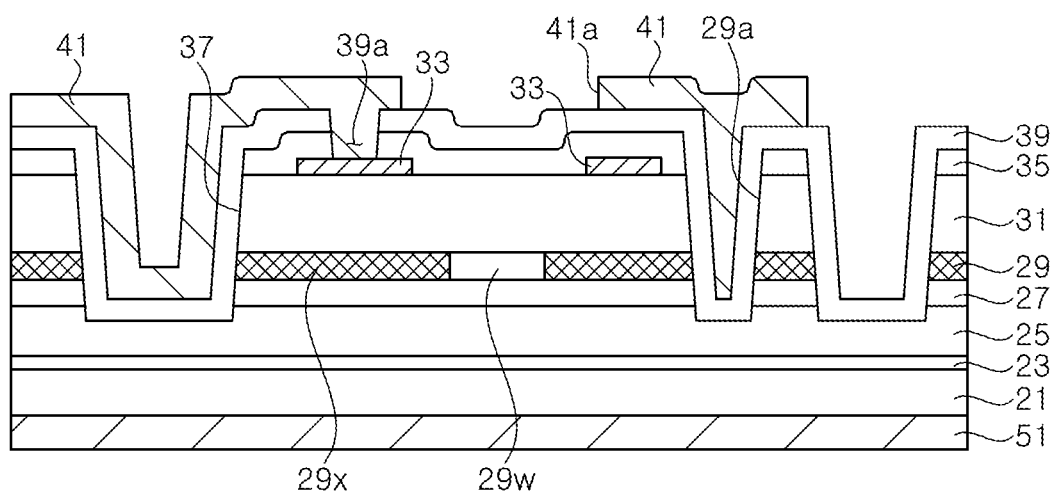
FIG. 2B is a schematic cross-sectional view taken along line A-A of FIG. 2A.

FIG. 1 is a schematic plan view of a vertical-cavity surface-emitting laser (VCSEL) according to an exemplary embodiment, FIG. 2A is an enlarged schematic plan view of an emitter region of FIG. 1, and FIG. 2B is a schematic cross-sectional view taken along line A-A of FIG. 2A.

Referring to FIG. 1, FIG. 2A, and FIG. 2B, a VCSEL 100 includes an emitter 150, a pad 40, and a connector 41. The emitter 150 includes a lower mirror 25, an active layer 27, an aperture forming layer 29, and an upper mirror 31. The VCSEL 100 may also include a substrate 21, a buffer layer 23, an ohmic contact layer 33, a surface protection layer 35, and an upper insulation layer 39, and a lower electrode 51. The VCSEL 100 may also include a trench 37 and an isolation region surrounded by the trench 37, and oxidation holes 29a disposed in the isolation region.

The substrate 21 may be a conductive substrate, for example, a semiconductor substrate, such as n-type GaAs. The substrate 21 may also be a growth substrate capable of growing semiconductor layers thereon, and may be selected according to the semiconductor layer to be grown.

The buffer layer 23 may be formed to assist the growth of the semiconductor layers, but in some exemplary embodiments, the buffer layer 23 may be omitted. When the substrate 21 is a GaAs substrate, the buffer layer 23 may be, for example, a GaAs layer.

The lower mirror 25 has a distributed Bragg reflector structure, and may include n-type semiconductor layers. The lower mirror 25 may be formed by, for example, repeatedly stacking semiconductor layers having different refractive indices. For example, the lower mirror 25 may be formed by alternately stacking an AlGaAs layer having a relatively low Al content and an AlGaAs layer having a relatively high Al content. In particular, the lower mirror 25 may be formed by alternately stacking an $Al_{0.15}Ga_{0.85}As$ layer having an Al content of 15% and an $Al_{0.85}Ga_{0.15}As$ layer having an Al content of 85%. As an n-type impurity, Si may be doped at a concentration of approximately 1 to $3 \times 10^{18}/cm^3$. The lower mirror 25 may include, for example, 30 or more pairs of semiconductor layers having different refractive indices. A thickness of each layer in the lower mirror 25 may be set to be one-fourth of a wavelength of light in each layer. One pair of semiconductor layers having different refractive indices may have a thickness in a range of about 100 nm to about 200 nm.

The active layer 27 may be disposed on the lower mirror 25, and may contact the lower mirror 25. The active layer 27 may have a barrier layer and a well layer, and the well layer may be interposed between the barrier layers. In particular, the active layer 27 may have a multi-quantum well structure having a plurality of well layers, and may include, for example, a stacked structure of GaAs/InGaAs/GaAs. Compositions of the barrier layer and the well layer may be varied according to a desired laser wavelength, and the well layer may include, for example, an InAlGaAs-based four-component, three-component, or two-component system. In addition, although the active layer 27 according to the illustrated exemplary embodiment is described as being GaAs-based, the inventive concepts are not limited thereto. For example, in some exemplary embodiments, InAlGaN-based or InAlGaP-based semiconductor layers may be used, and in this case, the barrier layer and the well layer may have a nitride-based or phosphide-based composition.

The well layer in the active layer 27 may be formed of an un-doped layer, and the barrier layer may also be formed of the un-doped layer. A thickness of the well layer may be about 2 nm to about 8 nm, and a thickness of the barrier layer may be approximately in a range of 2 nm to 15 nm.

The upper mirror 31 is disposed on the active layer 27. The upper mirror 31 may have a distributed Bragg reflector structure, and may include p-type semiconductor layers. The upper mirror 31 may be formed by, for example, repeatedly stacking semiconductor layers having different refractive indices. For example, the upper mirror 31, like the lower mirror 25, may be formed by alternately stacking an AlGaAs layer having a relatively low Al content and an AlGaAs layer having a relatively high Al content. In particular, the upper mirror 31 may be formed by alternately stacking an $Al_{0.15}Ga_{0.85}As$ layer having an Al content of 15% and an $Al_{0.85}Ga_{015}As$ layer having an Al content of 85%. As a p-type impurity, for example, C may be doped at a concentration of about 1 to $5 \times 10^{18}/cm^3$. The upper mirror 31 may include, for example, 20 or more pairs of semiconductor layers having different refractive indices. However, the number of pairs in the upper mirror 31 may be relatively smaller than that in the lower mirror 25. Meanwhile, a thickness of each layer may be set to be one-fourth of a wavelength of light in each layer.

The aperture forming layer 29 is disposed between the active layer 27 and the upper mirror 31. The aperture forming layer 29 may include an oxidation layer 29x and a window layer 29w. The window layer 29w is surrounded by the oxidation layer 29x, thereby forming an aperture defining a passage of current. The aperture forming layer 29 may be formed of, for example, an AlGaAs layer having a higher Al content than the layers in the upper mirror 31. For example, an Al content in the aperture forming layer 29 may be about 90% or more. The oxidation layer 29x is formed by oxidizing the AlGaAs layer in a region except the window layer 29w.

A width of the aperture formed by the oxidation layer 29x, that is, a width t of the window layer 29w is not particularly limited, but may be, for example, in a range of 3 μm to 12 μm.

Although the window layer 29w or the aperture is shown as having a disk shape in FIG. 2A, however, the inventive concepts are not limited thereto. The window layer 29w may have the disk shape, but may have other shapes, such as a polygonal shape close to the disk in other exemplary embodiments.

The ohmic contact layer 33 is disposed on the upper mirror 31. In particular, the ohmic contact layer 33 may form an ohmic contact with the upper mirror 31 on the isolation region surrounded by the trench 37. The ohmic contact layer 33 may include, for example, Ti, Pt, and Au, and ohmic contact may be formed using a rapid thermal annealing process, for example. The ohmic contact layer 33, as shown in FIG. 2A, may include a partial ring-shaped circular portion 33a and protrusions 33b protruding outwardly from the circular portion 33a. The protrusions 33b may increase a connection area for the connection of pad 40.

The surface protection layer 35 protects the upper mirror 31 and the ohmic contact layer 33 while forming the trench 37. The surface protection layer 35 may be, in particular, used as an etching mask. The surface protection layer 35 may be formed of a light transmissive substance, and may be formed of, for example, a silicon oxide film or a silicon nitride film. The surface protection layer 35 may also be formed to have a thickness, which is an integer multiple of one-fourth of a light wavelength in the surface protection layer 35. For example, when the surface protection layer 35 is formed of $Si_3N_4$, the surface protection layer 35 may be formed to have a thickness that is an integer multiple of about 118 nm. In addition, the surface protection layer 35 may be formed to have a tensile strain, and thus, may be formed at, for example, 250° C.

The trench 37 may pass through the upper mirror 31, the aperture forming layer 29, and the active layer 17, and to a partial thickness of the lower mirror 25. The trench 37 may have a substantially ring shape to define an isolation region therein, and the emitter 150 is formed in the isolation region. A width of the trench 37 may be in a range of 20 nm to 30 um, without being limited thereto. In addition, an outer wall of the trench 37 has substantially a circular shape, an inner side is a shape including a concave portion and a convex portion, without being limited thereto, and may be formed in a ring shape of various shapes in other exemplary embodiments.

Although all regions other than the window layer 29w are shown as the oxidation layer 29x in FIG. 2B, in some exemplary embodiments, a non-oxidation layer such as the window layer 29w may be retained outside of the trench 37. The aperture forming layer 29 in the isolated region surrounded by the trench 37 is oxidized and be formed as the oxidation layer, except for the window layer 29w.

The trench 37 improves light efficiency by preventing current from flowing to other regions except for the aperture, e.g., window layer 29w.

Oxidation holes 29a are formed to expose the aperture forming layer 29. To this end, the oxidation holes 29a may pass through the upper mirror 31 and the aperture forming layer 29, and may further pass through the active layer 27 and some thicknesses of the lower mirror 25. The oxidation holes 29a may also pass through the surface protection layer 35.

The oxidation holes 29a may be disposed outside of the ohmic contact layer 33, and in particular, may be disposed between the protrusions 33b. Further, the oxidation holes 29a are formed on the isolation region surrounded by the trench 37. The oxidation holes 29a are disposed in the isolation region away from the trench 37, and thus, defects that may occur during formation of the trench 37 may be prevented from moving into the aperture while forming the oxidation layer 29x. In addition, since the ohmic contact layer 33 is formed to have the protrusions 33b, the oxidation holes 29a may be disposed closer to one another, thereby reducing the size of the emitter 150.

In addition, the oxidation holes 29a may be formed to have sizes smaller than those of the protrusions 33b, respectively. For example, a planar area of the oxidation hole 29a may be smaller than that of the protrusion 33b. The sizes of the oxidation holes 29a are made to be relatively small, such that infiltration of moisture or the like through the oxidation holes 29a may be suppressed after the oxidation layer 29 is formed. For example, a depth of the oxidation holes 29a may be about 3 μm, and a diameter of the hole may be about 4 μm.

The aperture forming layer 29 is oxidized through the oxidation holes 29a, thereby defining the oxidation layer 29x and the window layer 29w. In this case, the upper mirror 31, the active layer 27, and the lower mirror 25 exposed to sidewalls of the oxidation holes 29a may be partially oxidized. According to the illustrated exemplary embodiment, the aperture is formed using the oxidation holes 29a rather than using the trench 37, and thus, it is possible to precisely form a small aperture while the isolation region is formed to have a relatively large size, thereby reducing the time required for the oxidation process. Furthermore, the size of the isolation region may be formed to be relatively large, and thus, a width of the ohmic contact layer 33 may be made to be relatively large, and, in particular, it is possible to form the protrusions 33b, thereby increasing a connection area of the pad 40.

The upper insulation layer 39 covers the surface protection layer 35, and covers the trench 37 and the oxidation holes 29a. The trench 37, the upper mirror 31, the oxidation layer 29x, the active layer 27, and the lower mirror 25 exposed in the oxidation holes 29a are covered with the upper insulation layer 39 to be insulated. The upper insulation layer 39 may be formed of a light transmissive substance, and may be formed of, for example, a silicon oxide film or a silicon nitride film. The upper insulation layer 39 may also be formed to have a thickness which an integer multiple of one-fourth of a light wavelength in the upper insulation layer 39. For example, when the upper insulation layer 39 is formed of $Si_3N_4$, a thickness thereof may be about 200 nm, 300 nm, or 500 nm. In addition, the upper insulation layer 39 is formed to have a tensile strain, and thus, may be formed at 250° C., for example.

Via holes 39a passing through the upper insulation layer 39 and the surface protection layer 35 to expose the ohmic contact layer 33 are formed. The via holes 39a are disposed to correspond to the protrusions 33b of the ohmic contact layer 33. As shown in FIG. 2A, the via holes 39a may be formed to expose the protrusion 33b and the circular portion 33a together. Although the via holes 39a are illustrated as having a quadrangular shape in FIG. 2A, the shapes thereof are not particularly limited and may be circular in some exemplary embodiments.

The pad 40 and the connector 41 may be disposed on the upper insulation layer 39. The pad 40 is a region for bonding wires, and is disposed over a relatively wide region. The pad 40 may be disposed, for example, outside of the trench 37 to reduce parasitic capacitance.

The connector 41 electrically connects the pad 40 and the ohmic contact layer 33. The connector 41 may be connected to the ohmic contact layer 33 through the via holes 39a. The connector 41 may have a partial ring-shaped circular portion along the ohmic contact layer 33, and an opening 41a may be provided inside the ring-shaped circular portion to emit a laser beam.

The pad 40 and the connector 41 may be formed of the same metal material, for example, Ti/Pt/Au. The pad 40 and the connector 41 may be formed to have a thickness of about 2 μm or more.

A lower electrode 51 is disposed under the substrate 21, and may be used as, for example, an n-pad. When the substrate 21 is a GaAs substrate, the lower electrode 51 may be formed of AuGe/Ni/Au, which may have a thickness of about 900 Å, 300 Å, 1000~3000 Å, respectively, for example.

FIGS. 3A, 3B, 4A, 4B, 5A, and 5B are schematic plan views and cross-sectional views illustrating a method of manufacturing a VCSEL according to an exemplary embodiment. Each cross sectional view is a view taken along line A-A of the corresponding plan view.

Figure 3A:
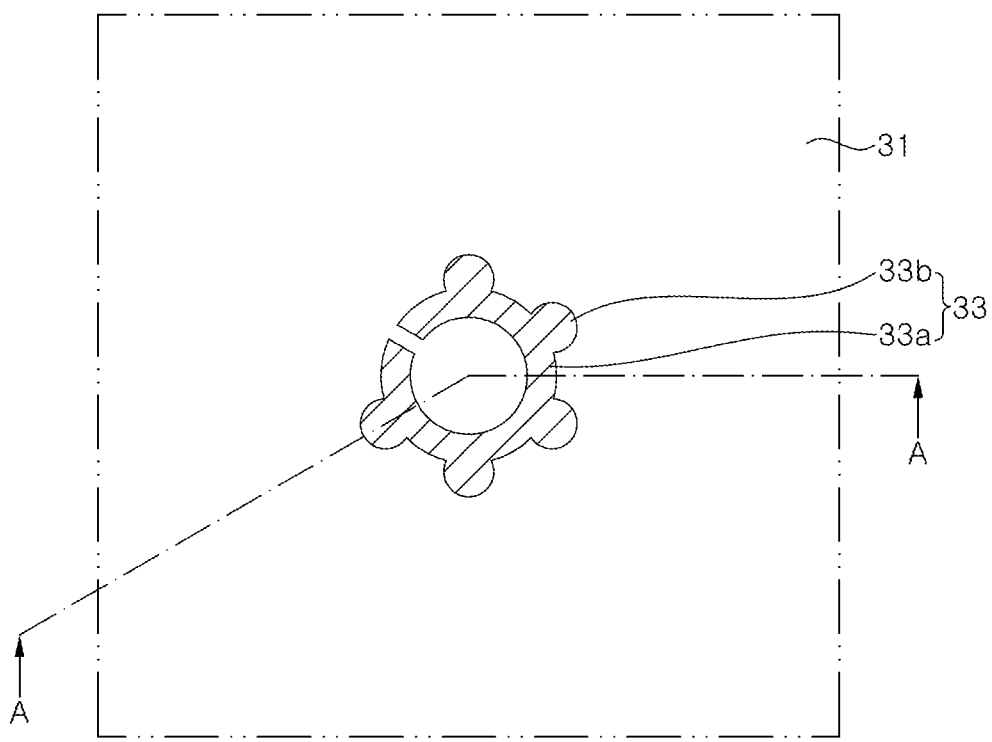
FIGS. 3A, 3B, 4A, 4B, 5A, and 5B are schematic plan views and cross-sectional views illustrating a method of manufacturing a VCSEL according to an exemplary embodiment.
Figure 3B:
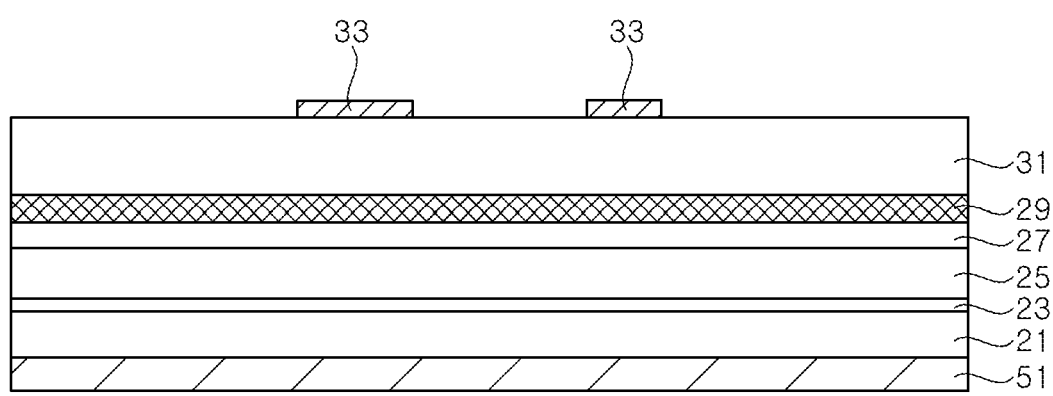

Referring to FIG. 3A and FIG. 3B, semiconductor layers 23, 25, 27, 29, and 31 are formed on a substrate 21, and an ohmic contact layer 33 is formed.

The substrate 21 may be, for example, an n-type GaAs substrate. The semiconductor layers may include a buffer layer 23, a lower mirror 25, an active layer 27, an aperture forming layer 29, and an upper mirror 31. The semiconductor layers may be formed using, for example, epitaxial growth techniques, such as metal organic chemical vapor deposition or molecular beam epitaxy.

The buffer layer 23 may be formed of, for example, a GaAs layer on the substrate 21. The lower mirror 25 may be formed on the buffer layer 23, and the active layer 27, the aperture forming layer 29, and the upper mirror 31 may be sequentially formed on the lower mirror 25. The lower mirror 25 and the upper mirror 31 may be formed by repeatedly stacking AlGaAs/AlGaAs having different Al compositions, respectively. Since the structures of the lower mirror 25, the active layer 27, the aperture forming layer 29, and the upper mirror 31 have been already described above, repeated descriptions thereof will be omitted to avoid redundancy.

The ohmic contact layer 33 is formed on the upper mirror 31. The ohmic contact layer 33 is formed to include a partial ring-shaped circular portion 33a and protrusions 33b protruding outwardly from the circular portion 33a. The ohmic contact layer 33 may be heat-treated through a rapid thermal annealing process after forming a metal layer using a lift-off technique. The metal layer may be formed of, for example, Ti/Pt/Au, which may be formed to have thicknesses of about 300 Å, 300 Å, and 1000 to 3000 Å, respectively. The thermal annealing process may provide a favorable ohmic contact between the ohmic contact layer 33 and the upper mirror 31.

Although FIG. 3A exemplarily shows that a single ohmic contact layer 33 is formed on the substrate 21, in some exemplary embodiments, the substrate 21 may have a diameter of, for example, 10 mm, and multiple ohmic contact layers 33 may be formed in each device region.

In addition, although the ohmic contact layer 33 may use a negative photoresist or a positive photoresist as a mask, the positive photoresist is more suitable for forming a high density array.

Figure 4A:
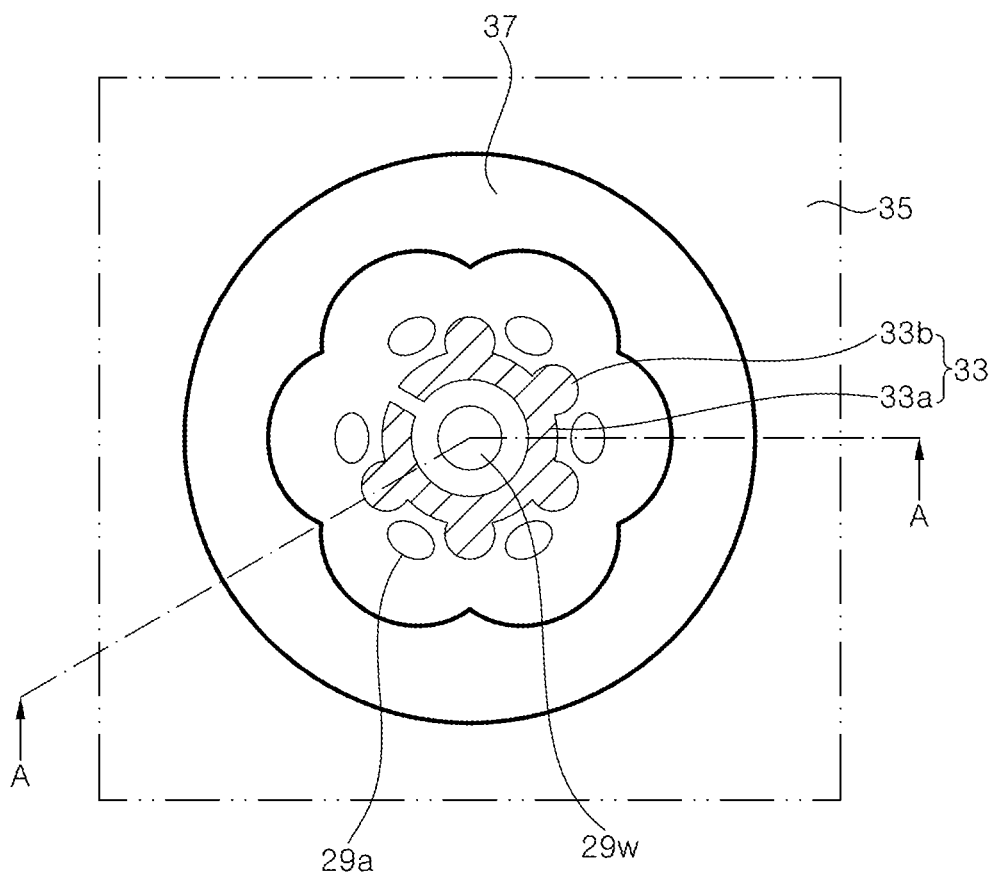
Figure 4B:
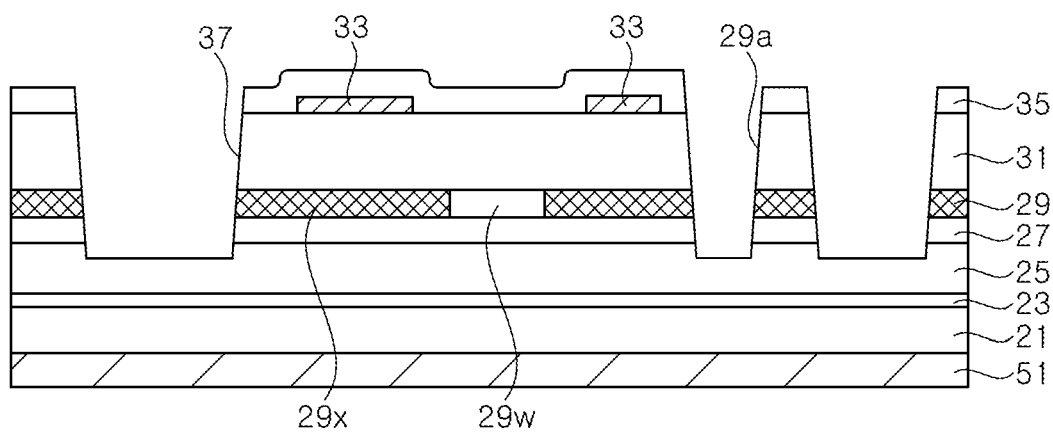

Referring to FIG. 4A and FIG. 4B, a surface protection layer 35 covering the upper mirror 31 and the ohmic contact layer 33 is formed. The surface protection layer 35 protects the upper mirror 31 while forming a trench 37 and oxidation holes 29a.

The surface protection layer 35 may be formed of, for example, $Si_3N_4$ or $SiO_2$, and may have a thickness which is an integer multiple of one-fourth of a light wavelength in the surface protection layer 35. For example, when the surface protection layer 35 is formed of $Si_3N_4$, a thickness thereof may be formed to be an integer multiple of about 118 nm.

Next, a photoresist is formed on the surface protection layer 3, and the trench 37 and the oxidation holes 29a are formed by performing an etching process using the photoresist as a mask. An isolation region surrounded by the trench 37 is formed by the trench 37, and the oxidation holes 29a are disposed around the ohmic contact layer 33 in the isolation region, while being spaced apart from the trench 37. The photoresist may be removed after the etching process is complete.

The trench 37 and the oxidation holes 29a may pass through the surface protection layer 35, the upper mirror 31, the aperture forming layer 29, and the active layer 27, and to a partial thickness of the lower mirror 25.

The oxidation holes 29a may be disposed between the protrusions 33b, and may have sizes smaller than those of the protrusions 33b. The oxidation holes 29a have a depth of about 3 μm, a diameter (or width) of about 4 μm at a side of an inlet, and sidewalls thereof may be inclined at about 80 degrees. Shapes of the oxidation holes 29a may vary, which will be described in more detail later with reference to FIGS. 9A through 9C. Since the ohmic contact layer 33 is formed to have the protrusions 33b, the width of the circular portion 33a may be reduced, thereby reducing a distance between the oxidation holes 29a.

Subsequently, the aperture forming layer 29 exposed through the oxidation holes 29a is oxidized. Oxidation may be performed at a temperature in a range of 400° C. to 430° C., for example. By adjusting an Al composition ratio of the aperture forming layer 29, the temperature and composition of the aperture forming layer 29 may be set to exhibit an oxidation rate of 10 times or more than those of the layers in the lower and upper mirrors 25 and 31.

An oxidation layer 29x is formed by the oxidation process in the aperture forming layer 29 around the trench 37 and the oxidation holes 29a. The oxidation layer 29x proceeds to the inside of the aperture forming layer 29 through the aperture forming layer 29 exposed to inner walls of the trench 37 and the oxidation holes 29a. Accordingly, a window layer 29w (aperture) is formed under a region surrounded by the ohmic contact layer 33. Meanwhile, as shown in FIG. 4B, a portion of the oxidation layer 29x may also be formed in an outer region of the trench 37.

Since the oxidation proceeds at a relatively high temperature of 400° C. to 430° C., surface defects generated while forming the trench 37 may move. At this time, since the oxidation hole 29a are disposed in the isolation region, the defects may be prevented from moving toward the window layer 29w.

Figure 5A:
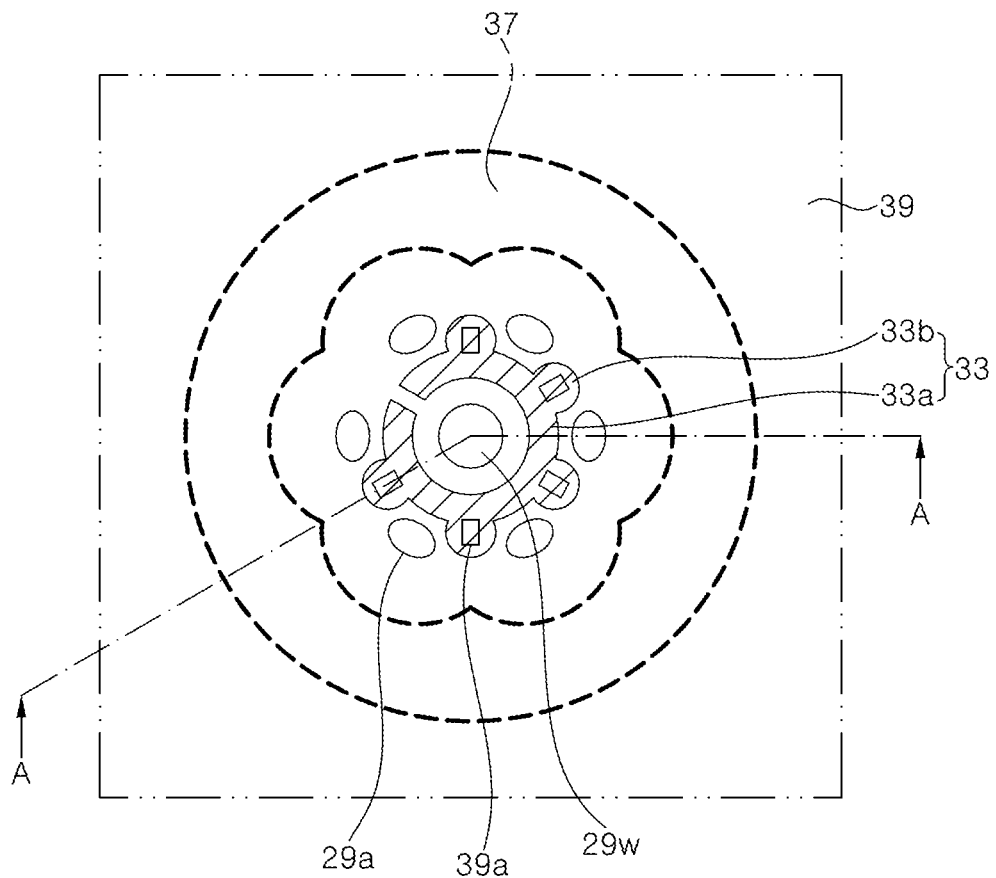
Figure 5B:
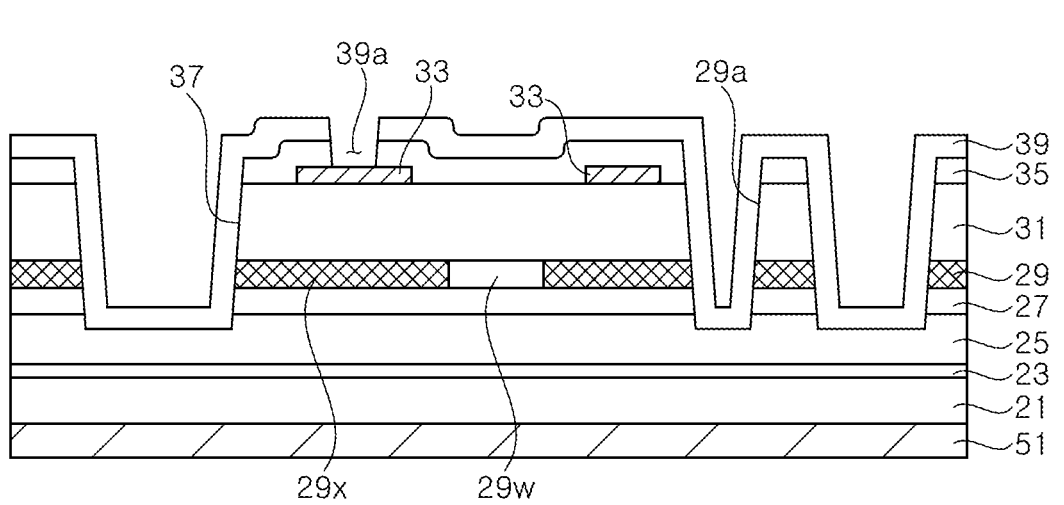

Referring to FIG. 5A and FIG. 5B, an upper insulation layer 39 is formed on the surface protection layer 35. The upper insulation layer 39 may be formed of a light transmissive substance, and may be formed of, for example, $Si_3N_4$ or $SiO_2$. The upper insulation layer 39 covers sidewalls and bottoms of the trench 37 and the oxidation holes 29a to insulate semiconductor layers exposed in the trench 37 and the oxidation holes 29a.

Via holes 39a may be formed by patterning the upper insulation layer 39 and the surface protection layer 35 to expose the ohmic contact layer 33. The via holes 39a may be formed to correspond to the protrusions 33b of the ohmic contact layer 33, as shown in FIG. 5A.

According to an exemplary embodiment, when the via holes 39a are formed, a device isolation region, for example, a scribing line to divide a plurality of device regions formed on the substrate 21 may be formed together. The scribing line may be formed by etching the surface protection layer 35 and the upper insulation layer 39, such that the surface protection layer 35 and the upper insulation layer 39 are prevented from being peeled off during a subsequent scribing process to individualize the devices.

Subsequently, a pad 40 and a connector 41 are formed, as shown in FIG. 1. The pad 40 and the connector 41 may be formed using a lift off technique, and may be formed of, for example, Ti/Pt/Au. In addition, a lower electrode 51 may be formed on a lower surface of the substrate 21.

Thereafter, the devices are individualized along the scribing line, thereby forming the VCSEL of FIG. 1.

Figure 6:
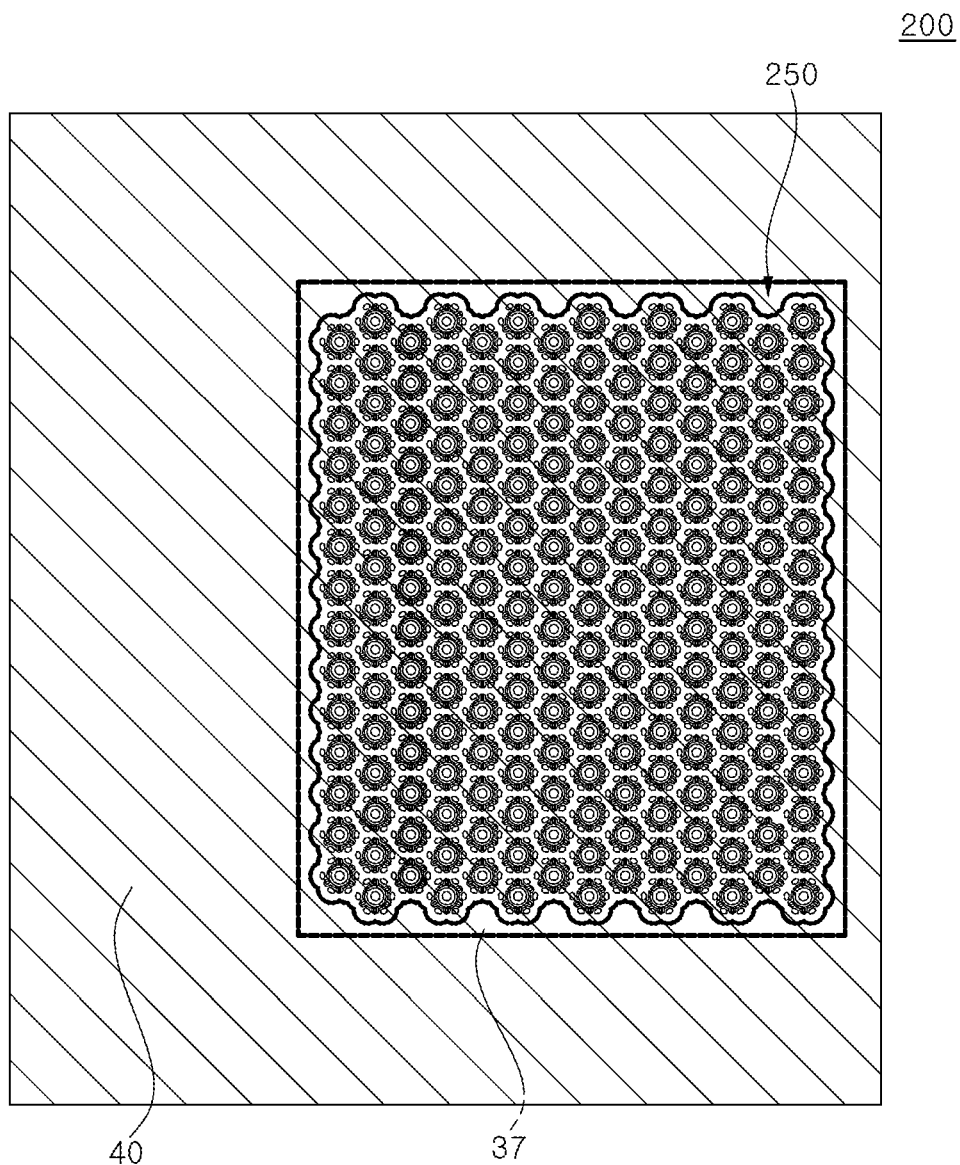
FIG. 6 is a schematic plan view of a VCSEL according to another exemplary embodiment.
Figure 7A:
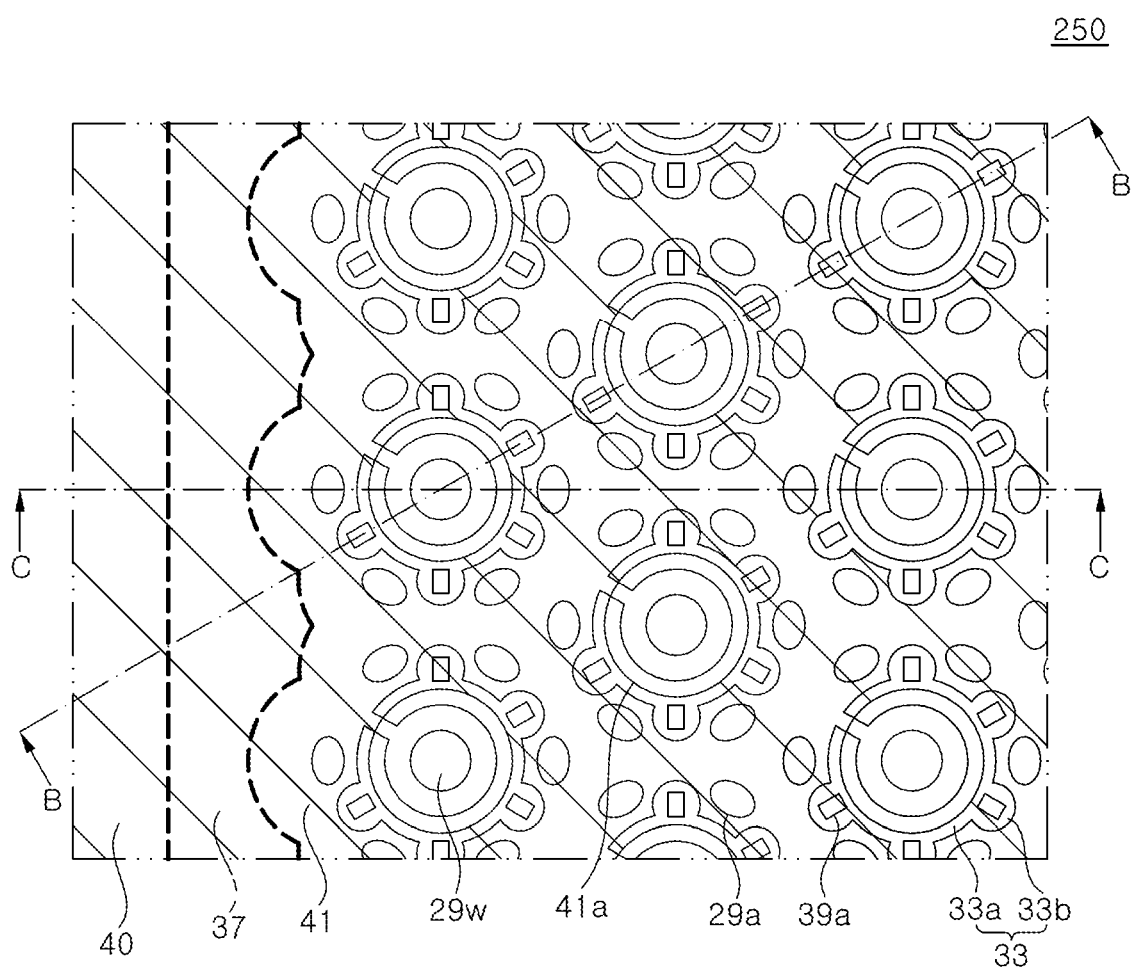
FIG. 7A is an enlarged schematic plan view of a portion of an emitter array of FIG. 6.
Figure 7B:
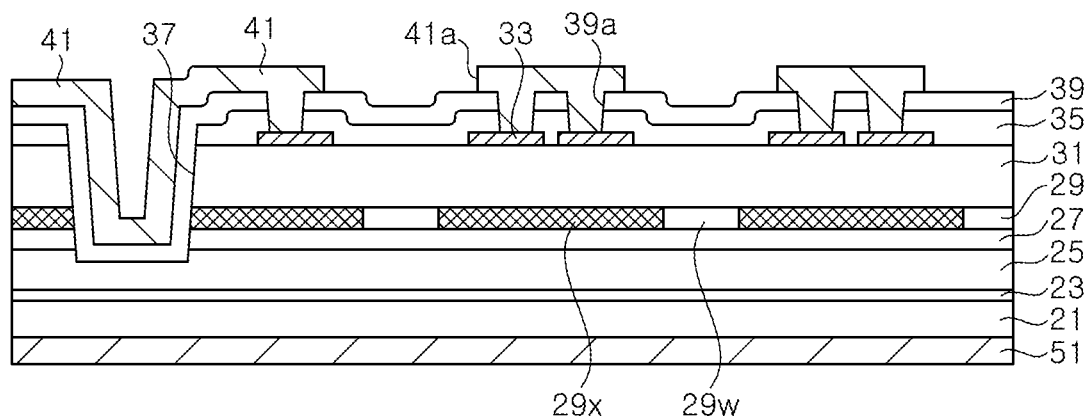
FIG. 7B is a schematic cross-sectional view taken along line B-B of FIG. 7A.
Figure 7C:
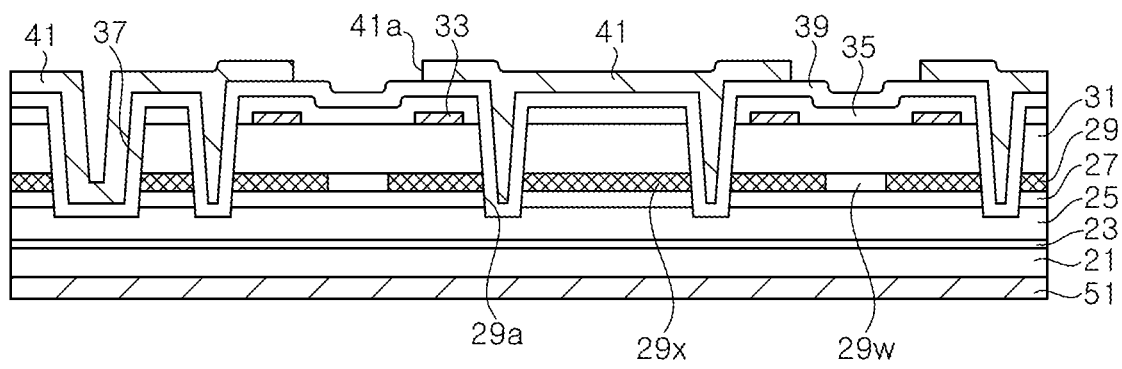
FIG. 7C is a schematic cross-sectional view taken along line C-C of FIG. 7A.

FIG. 6 is a schematic plan view of a VCSEL according to another exemplary embodiment, FIG. 7A is an enlarged schematic plan view of a portion of an emitter array of FIG. 6, FIG. 7B is a schematic cross-sectional view taken along line B-B of FIG. 7A, and FIG. 7C is a schematic cross-sectional view taken along line C-C of FIG. 7A.

Referring to FIG. 6, FIG. 7A, FIG. 7B, and FIG. 7C, a VCSEL 200 is generally similar to the VCSEL 100 described with reference to FIG. 1, FIG. 2A, and FIG. 2B, except that a plurality of emitter arrays 250 are included, and accordingly, shapes of the trench 37 and the pad 40 are modified. As such, repeated descriptions of the substantially the same elements of the VCSEL already described above will be omitted.

The trench 37 is formed to have a ring shape to define an isolation region therein. The emitter array 250 may be disposed in the isolated region surrounded by the ring-shaped trench 37, and the pad 40 is located outside of the trench 37. Emitters in the emitter array 250 may be arranged in a honeycomb shape, for example, as shown in the drawing.

The pad 40 may be formed adjacent to a region of the emitter array 250 and on one side of the substrate 21. In the illustrated exemplary embodiment, as shown in FIG. 6, the pad 40 may be formed over a wide area outside of the trench 37 to facilitate electrical connection. However, the inventive concepts are not limited thereto, and in some exemplary embodiments, the pad 40 may be formed to a shape similar to that shown in FIG. 1.

The trench 37 is formed to have a relatively greater width than a thickness of the pad 40. For example, the pad 40 may be formed to have a thickness of 2 μm to 6 μm and the trench 37 may be formed to have a relatively greater width of 20 μm to 30 μm. Accordingly, disconnection of a connector 41 due to the trench 37 may be prevented.

As shown in FIG. 7A, an ohmic contact layer 33, oxidation holes 29a, and via holes 39a are formed in each emitter region, and an opening 41a, through which the laser can be emitted, is formed by the connector 41. Each emitter includes a lower mirror 25, an active layer 27, an aperture forming layer 29, and an upper mirror 31, like those described with reference to FIG. 1, FIG. 2A, and FIG. 2B. The aperture forming layer 29 includes an oxidation layer 29x and a window layer 29w. The aperture forming layer 29 in the emitter array 250 is the oxidation layer 29x, except for the window layer 29w, and thus, current flow is limited to the window layer 29w. A basic structure of each emitter in the emitter array 250 is substantially the same as that of the emitter 150 described above.

An ohmic contact layer 33 may be formed in each emitter, and, as described above, the ohmic contact layer 33 may include a partial ring-shaped circular portion 33a and protrusions 33b. Further, in each emitter region, oxidation holes 29a are disposed between the protrusions 33b, and via holes 39a are formed to correspond to the protrusions 33b. The oxidation holes 29a and the via holes 39a formed in each emitter are substantially the same as those formed in the emitter 150 described above. In particular, by forming the oxidation holes 29a separately in each emitter, sizes of the oxidation holes 29a may be smaller than those of the protrusions 33b, thereby improving reliability of the device.

The connector 41 connecting the pad 40 and the ohmic contact layers 33 may be connected to each emitter through the via holes 39a. Each of the emitters may be connected in parallel. Although the connector 41 described above has the partial ring shape, the connector 41 according to the illustrated exemplary embodiment may have a mesh shape forming circular openings 41a as shown in the drawings.

Further, the connector 41 may cover all of the trenches 37, and, accordingly, disconnection of the connector 41 in the trench 37 may be further prevented.

Since a manufacturing method of the VCSEL 200 having the emitter array 250 is substantially similar to that of the VCSEL 100 described above, repeated descriptions thereof will be omitted.

According to the illustrated exemplary embodiment, the emitters in the emitter array 250 are not separated from one another by the trench. Accordingly, it is possible to prevent the connector 41 from being disconnected in the trench, which may provide a large step difference. Further, damage to the window layer 29w due to surface defects caused during the formation of the trench may be prevented, thereby providing a highly reliable emitter array.

Figure 8:
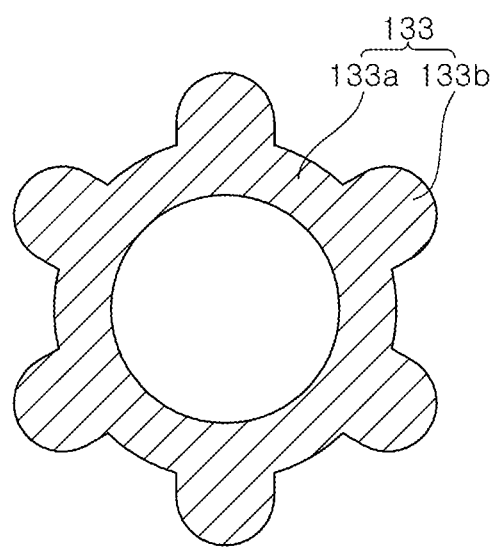
FIG. 8 is a schematic plan view illustrating an ohmic contact layer according to another exemplary embodiment.

FIG. 8 is a schematic plan view for illustrating an ohmic contact layer according to another exemplary embodiment.

Referring to FIG. 8, unlike the ohmic contact layer 33 including the partial ring-shaped circular portion 33a and protrusions 33b, an ohmic contact layer 133 according to the illustrated exemplary embodiment includes a ring-shaped circular portion 133a and protrusions 133b. That is, the circular portion 133a according to the illustrated exemplary embodiment has a constant width and a closed circular ring shape, and the protrusions 133b are spaced apart from one another at a regular interval and are disposed symmetrically. In this case, oxidation holes may be disposed between the protrusions 133b.

The ohmic contact layer 133 are symmetrically formed, and thus, an aperture 29w formed therein may be formed to have a shape closer to a circle.

The oxidation holes 29a have been described as being disposed around the ohmic contact layer 33, and each of the oxidation holes 29a has been described as having an elliptic shape. Long axes of the oxidation holes 29a are disposed in a direction perpendicular to a straight line connecting a center of the emitter 150 and a center of the oxidation hole 29a, respectively. Accordingly, the shape of the window layer 29w (aperture) surrounded by the oxidation layer 29x formed by using the oxidation holes 29a becomes almost circular.

Figure 9A:
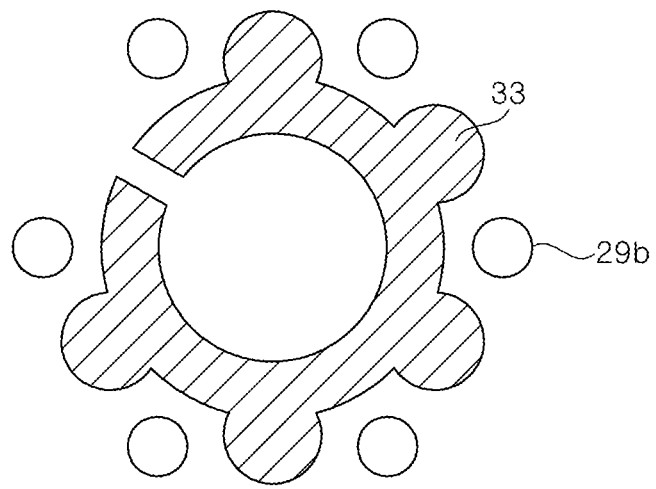
FIGS. 9A, 9B, and 9C are schematic plan views illustrating oxidation holes for forming an oxidation layer according to exemplary embodiments.
Figure 9B:
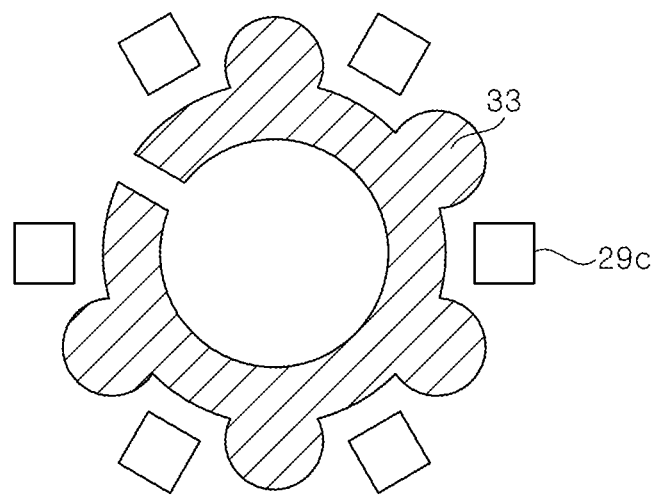
Figure 9C:
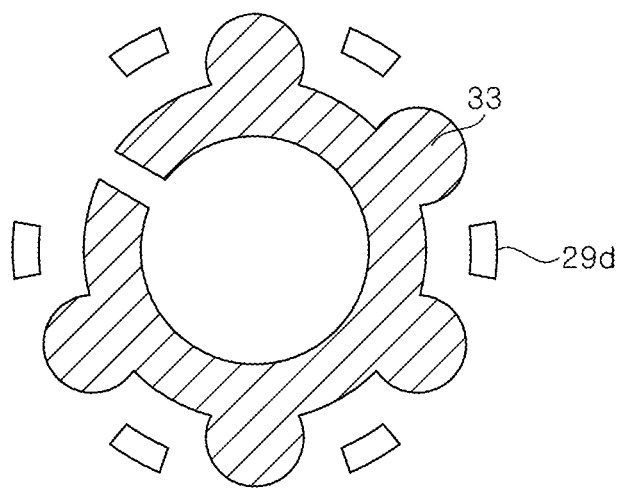

However, the inventive concepts are not limited to a particular shape of the oxidation holes 29a, and the shape of the oxidation holes 29a may be variously modified. FIGS. 9A through 9C are schematic plan views illustrating oxidation holes for forming the oxidation layer according to exemplary embodiments.

As shown in FIG. 9A, the oxidation holes 29b may have substantially a circular shape. Oval or circular oxidation holes 29a and 29b may be easily patterned, and may increase stability of the upper insulation layer 39 or the connector 41 formed thereon. Meanwhile, as shown in FIG. 9B, the oxidation holes 29c may have substantially a square or rectangular shape and be disposed at locations corresponding to each vertex of the regular hexagon. In addition, as shown in FIG. 9C, although the oxidation holes 29d may have a quadrangular shape, a side close to the center of the emitter may be curved.

Moreover, in some exemplary embodiments, the number of oxidation holes surrounding the center of the emitter may be greater than six, and, accordingly, it is possible to form the shape of the aperture much closer to a circle.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A vertical-cavity surface-emitting laser (VCSEL), comprising:
a substrate;
a lower mirror;
an upper mirror;
an active layer interposed between the lower mirror and the upper mirror;
an aperture forming layer interposed between the upper mirror and the active layer, and including an oxidation layer and a window layer surrounded by the oxidation layer;
a ring-shaped trench passing through the upper mirror, the aperture forming layer, and the active layer to define an isolation region therein;
an oxidation region disposed in the isolation region surrounded by the trench;
an upper insulation layer covering the oxidation region; and
an ohmic contact layer disposed between the upper mirror and the upper insulation layer; and
a connector disposed on the upper insulation layer and electrically connected to the ohmic contact layer,
wherein the upper insulation layer covers a part of the ohmic contact layer and includes at least one via hole exposing an upper surface of the ohmic contact layer,
wherein the connector substantially covers the entire at least one via hole,
wherein the connector includes a ring-shaped circular portion and a protrusion region protruding outwardly from the circular portion, and
wherein the oxidation region includes an oxidation hole disposed between the protrusion region and the substrate.

2. The VCSEL of claim 1, wherein the trench passes through a partial thickness of the lower mirror.

3. The VCSEL of claim 1, wherein the connector is partially incised.

4. The VCSEL of claim 1, wherein the ohmic contact layer has a symmetrical structure, and includes a circular portion and protrusions protruding outwardly from the circular portion such that the protrusions are spaced apart at an equal interval from one another.

5. The VCSEL of claim 1, wherein the oxidation hole has substantially an elliptic shape.

6. The VCSEL of claim 1, wherein the oxidation hole has substantially a circular or a quadrangular shape.

7. The VCSEL of claim 1, further comprising
a surface protection layer covering the ohmic contact layer and the upper mirror,
wherein:
the trench and the oxidation hole pass through the surface protection layer; and
the upper insulation layer covers the trench and the oxidation hole.

8. The VCSEL of claim 7, wherein the via hole is formed in plural and are disposed to correspond to the protrusions.

9. The VCSEL of claim 8, further comprising a pad, wherein:
the pad is disposed outside of the trench; and
the connector extends from the pad.

10. A vertical-cavity surface-emitting laser (VCSEL) including an emitter array, comprising:
a substrate;
a lower mirror;
an upper mirror;
an active layer interposed between the lower mirror and the upper mirror;
an aperture forming layer interposed between the upper mirror and the active layer, and including an oxidation layer and a window layer surrounded by the oxidation layer;
a ring-shaped trench passing through the upper mirror, the aperture forming layer, and the active layer to define an isolation region therein;
an oxidation region disposed in the isolation region surrounded by the trench;
an upper insulation layer covering the oxidation region; and
an ohmic contact layer disposed between the upper mirror and the upper insulation layer; and
a connector disposed on the upper insulation layer and electrically connected to the ohmic contact layer,
wherein:
the emitter array includes a plurality of emitters and is disposed in the isolation region surrounded by the trench;
the oxidation region is disposed to correspond to the emitters in the emitter array;
the upper insulation layer covers a part of the ohmic contact layer and includes at least one via hole exposing an upper surface of the ohmic contact layer;
the connector substantially covers the entire at least one via hole;
the connector includes a ring-shaped circular portion and a protrusion region protruding outwardly from the circular portion; and
the oxidation region includes an oxidation hole disposed between the protrusion region and the substrate.

11. The VCSEL of claim 10, wherein the trench extends to a partial thickness of the lower mirror from the upper mirror.

12. The VCSEL of claim 10, wherein the ohmic contact layer is formed in plural to correspond to each emitter.

13. The VCSEL of claim 12, wherein the connector is partially incised.

14. The VCSEL of claim 12, wherein the ohmic contact layer has a symmetrical structure, and includes a circular portion and protrusions protruding outwardly from the circular portion such that the protrusions are spaced apart at an equal interval from one another.

15. The VCSEL of claim 12, further comprising a surface protection layer covering the ohmic contact layer and the upper mirror,
wherein:
the trench and the oxidation hole pass through the surface protection layer; and
the upper insulation layer covers the trench and the oxidation hole.

16. The VCSEL of claim 15, wherein the via hole is formed in plural and are disposed to correspond to the protrusions.

17. The VCSEL of claim 16, further comprising a pad, wherein:
the pad is disposed outside of the trench; and
the connector extends from the pad.

18. The VCSEL of claim 17, wherein the connector has a mesh shape including circular openings corresponding to each emitter.

19. The VCSEL of claim 12, wherein the oxidation hole has at least one of an elliptic, a circular, and a quadrangular shape.

* * * * *